United States Patent [19]
Young

[11] Patent Number: 6,144,220
[45] Date of Patent: Nov. 7, 2000

[54] FPGA ARCHITECTURE USING MULTIPLEXERS THAT INCORPORATE A LOGIC GATE

[75] Inventor: Steven P. Young, San Jose, Calif.

[73] Assignee: Xilinx, Inc., San Jose, Calif.

[21] Appl. No.: 09/323,879

[22] Filed: Jun. 1, 1999

Related U.S. Application Data

[62] Division of application No. 08/708,247, Sep. 3, 1996, Pat. No. 5,933,023.

[51] Int. Cl.[7] .............................. H01L 28/00; G06F 7/38
[52] U.S. Cl. ................................ 326/41; 326/41; 326/40; 326/39; 326/38; 326/37
[58] Field of Search ................................ 326/37, 39, 40, 326/41, 38, 105, 106, 108; 327/407

[56] References Cited

U.S. PATENT DOCUMENTS

| | | |
|---|---|---|
| 4,758,745 | 7/1988 | Elgamal et al. . |
| 4,870,302 | 9/1989 | Freeman . |
| 5,243,238 | 9/1993 | Kean . |
| 5,517,135 | 5/1996 | Young . |
| 5,636,368 | 6/1997 | Harrison et al. ........................ 395/500 |
| 5,742,180 | 4/1998 | DeHon et al. ............................ 326/40 |
| 5,804,986 | 9/1998 | Jones ......................................... 326/40 |
| 5,894,565 | 4/1999 | Furtek et al. ........................... 395/500 |
| 6,049,223 | 4/2000 | Lytle et al. ............................... 326/40 |

*Primary Examiner*—Michael Tokar
*Assistant Examiner*—Vibol Tan
*Attorney, Agent, or Firm*—Edel M. Young; E. Eric Hoffman

[57] ABSTRACT

A structure in which blocks of random access memory, or RAM, are integrated with FPGA configurable logic blocks. Routing lines which access configurable logic blocks also access address, data, and control lines in the RAM blocks. Thus, the logic blocks of the FPGA can use these routing lines to access portions of RAM. According to the invention, a decoder which enables dedicated RAM is configurable to respond in many different ways to decoder input signals. The decoder can be programmed to be enabled by any combination of decoder input signals and can be programmed to ignore any number of decoder input signals. The ability to ignore input signals is important in FPGAs because it saves having to route a disabling signal to an unused decoder input terminal. The decoder can also be programmed to be disabled regardless of decoder input signals. The decoder can be programmed to treat a set of input signals as an address, and can invert or not invert the address.

14 Claims, 13 Drawing Sheets

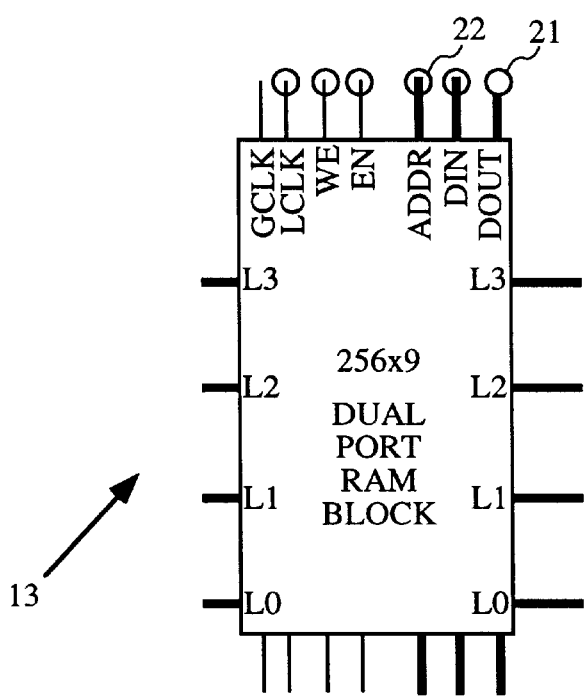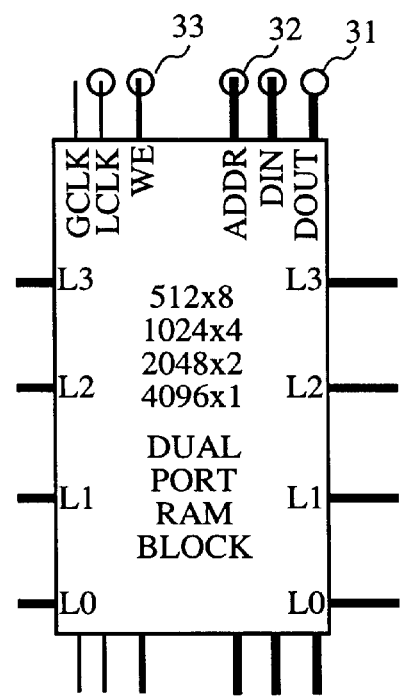
FIG. 1B  FIG. 1C

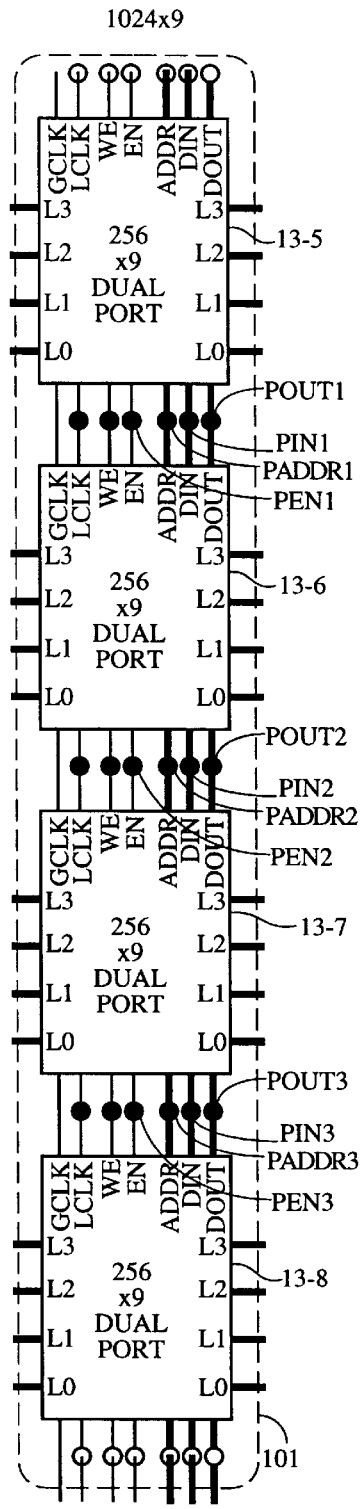
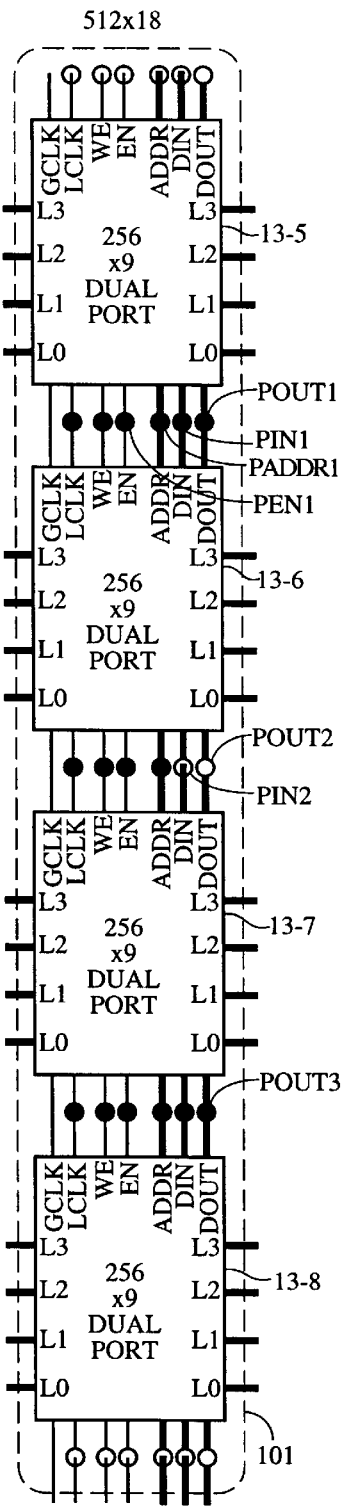
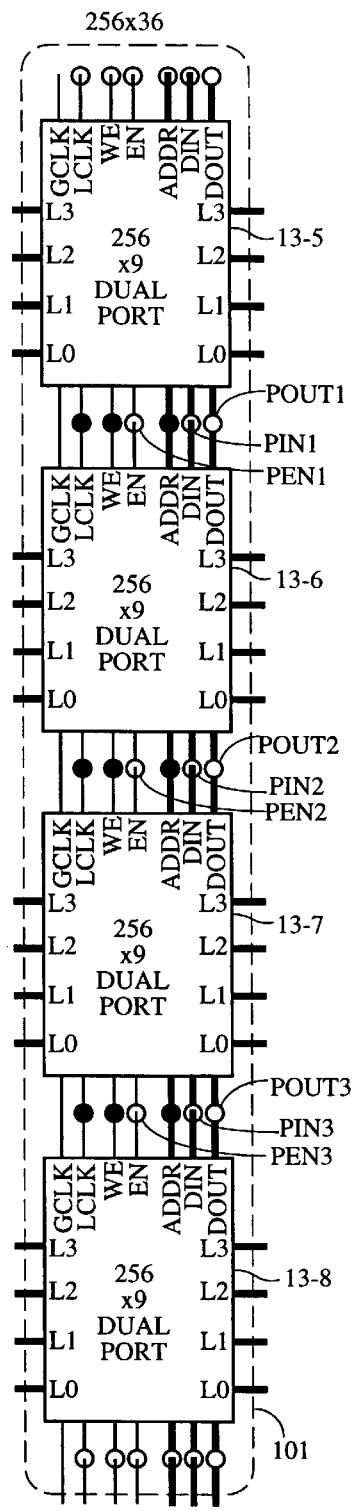
FIG. 6A  FIG. 6B  FIG. 6C

FPGA ARCHITECTURE USING MULTIPLEXERS THAT INCORPORATE A LOGIC GATE

RELATED PATENT APPLICATIONS

The present application is a divisional of U.S. patent application Ser. No. 08/708,247 filed Sep. 3, 1996, now U.S. Pat. No. 5,933,023, and relates to the following patent applications, all assigned to Xilinx, Inc, assignee of the above application, which are incorporated herein by reference:

1. U.S. Pat. No. 5,682,107 entitled "Tile Based Architecture for FPGA" by Danesh Tavana, Wilson K. Yee, and Victor A. Holen which was issued Oct. 28, 1997; and
2. U.S. Pat. 5,517,135 entitled "Bidirectional Tristate Buffer with Default Input" which was filed Jul. 26, 1995 by Steven P. Young and issued May 14, 1996.

FIELD OF THE INVENTION

The invention relates to programmable logic devices formed in integrated circuits and more particularly to field programmable logic devices or field programmable gate arrays.

BACKGROUND OF THE INVENTION

A field programmable gate array (FPGA) comprises an array of programmable logic blocks which can be programmably interconnected to each other to provide a logic function desired by a user. U.S. Pat. No. 4,870,302, reissued as U.S. Patent Re34,363 to Ross Freeman describes the first FPGA, and is incorporated herein by reference. Later patents such as U.S. Pat. No. 4,758,745 to Elgamal, and U.S. Pat. No. 5,243,238 to Kean, and published application WO 93/05577 invented by Furtek and owned by Concurrent Logic, Inc. describe other FPGA architectures. These patents and application are also incorporated herein by reference. The Xilinx 1994 Data Book entitled "The Programmable Logic Data Book", available from Xilinx, Inc., 2100 Logic Drive, San Jose, Calif. 95124 describes several FPGA products. As illustrated in the Xilinx data book, for example at page 2–114, FPGA products typically include a regular array of logic blocks, the number of which varies from one product to another.

An FPGA architecture includes a programmable routing structure and an array of configurable logic blocks. The programmable routing matrix includes means for connecting logic blocks to each other. Thus an FPGA provides a combination of programmable logic and programmable connections to a general routing structure.

In a typical FPGA application, the PIPs are turned on ahead of time by loading appropriate values into configuration memory cells associated with the PIPs, thus creating paths and establishing the logic performed by the configurable logic blocks. During operation, signals on the paths change dynamically as values are being written to and read from flip flops.

Some users need blocks of random access memory (RAM), for example so that complex functions generated in one part of the FPGA chip can be synchronized with complex logic generated in another part of the chip. For another example, users may want to provide a FIFO (first-in-first-out register) for buffering high speed data onto and off the chip, or to provide register banks for use by other logic in the chip.

In conventional FPGA chips these blocks of RAM are generated by configuring programmable parts of the FPGA, thus making these parts of the FPGA unavailable for other uses. When a common function such as PAM is desired by many users, it becomes economical to dedicate a portion of the chip to this purpose, thus allowing the particular function to be implemented at high density and leaving other parts of the FPGA free for less predictable uses.

The Altera FLEX 10K chip includes blocks of RAM that can be accessed by logic blocks in the chip. The Altera FLEX 10K structure is described briefly in a product information bulletin from Altera Corp. dated January 1996 and entitled "Benefits of Embedded RAM in FLEX 10K Devices". A block diagram on this publication shows a RAM/ROM block with several configurations. The RAM/ROM block is in an EAB (embedded array block) that includes input flip flops, a write pulse circuit, and input multiplexers for generating data, address, and write-enable signals from data, address, write enable, and input clock signals. The EAB also includes data-out flip flops and multiplexers for generating data-out signals. The Altera publication indicates that when large RAMs are desired, EABs are cascaded to implement larger RAMs.

However, these dedicated RAM blocks are accessed through general interconnect lines, and using general interconnect lines to access RAM decreases the availability of general interconnect lines for routing other logic signals.

SUMMARY OF THE INVENTION

According to the present invention, blocks of random access memory, or RAM, integrated with FPGA configurable logic blocks include dedicated routing lines. General routing lines which access configurable logic blocks also access address, data, and control lines in the RAM blocks through the dedicated routing lines. Thus, the logic blocks of the FPGA can use these general and dedicated routing lines to access portions of RAM. These dedicated routing lines allow efficient connection of RAM blocks and arrays of RAM blocks whether the RAM blocks are configured long, wide, small, or large. Also, the dedicated routing lines allow logic blocks to conveniently access RAM blocks in a remote part of the chip. Access to the RAM blocks is efficient in any RAM configuration. Bidirectional buffers or pass devices segment the address and data lines at each RAM block so that a selectable number of RAM blocks can operate together as a RAM.

In one embodiment of the invention, adjacent RAM blocks are joined through tristate bidirectional buffers. These buffers include a default input such that the signal applied to one of the lines connected to the bidirectional buffer is always applied to the input terminal of a buffer element and applied by the output terminal of the buffer element to any load which may be connected to the buffer output terminal. Thus the buffer is never left floating, and the load connected to the output terminal of the buffer switches more quickly than if a signal had to flow through another pass transistor as with a symmetrical bidirectional buffer. In a preferred embodiment, the tristate bidirectional buffer with default input requires only four routing transistors plus the transistors which comprise the memory cells and the buffer element. Further, attaching a load to the output terminal of the buffer element may allow the direction control transistors to be smaller for the same switching speed than attaching the load directly to the line carrying the signal to be buffered. This buffer is further described in U.S. Pat. No. 5,517,135.

According to yet another aspect of the invention, a decoder which enables dedicated RAM is configurable to respond in many different ways to decoder input signals. The decoder can be programmed to be enabled by any combination of decoder input signals and can be programmed to ignore any number of decoder input signals. The ability to ignore input signals is important in FPGAs because it saves having to route a disabling signal to an unused decoder input terminal. The decoder can also be programmed to be disabled regardless of decoder input signals. It can be programmed to treat a set of input signals as an address. It can invert or not invert the address.

In one embodiment, data bus line segments in one RAM block are joined to line segments in another RAM block in a staggered or rotating fashion. For example, line 8 in one RAM block is joined to line 7 in the next RAM block. This means that several RAM blocks can be configured to be deep but not wide, so the RAM in one RAM block does not use all its own data lines and adjacent RAM blocks can use some of the lines, and data in these adjacent RAM blocks can be conveniently accessed on data lines which do not contend.

BRIEF DESCRIPTION OF THE DRAWINGS

FIGS. 1B and 1C illustrate two embodiments of RAM block 13 of FIG. 1A, showing external connections only.

FIGS. 6A–6C show four adjacent RAM blocks of the embodiment in FIG. 2, configured in three possible configurations to form RAMs of different word lengths.

DETAILED DESCRIPTION

Figure 1A:
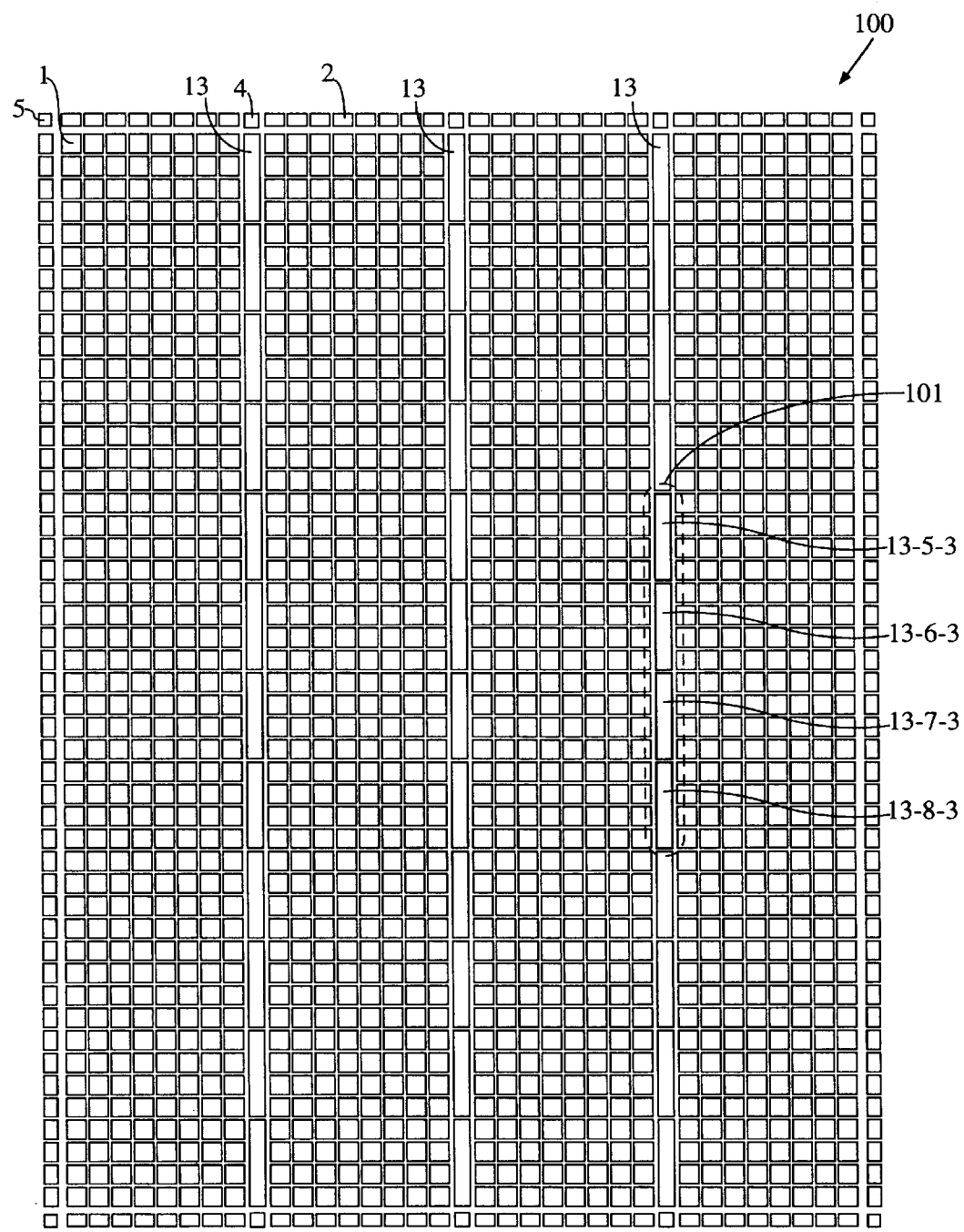
FIG. 1A shows an FPGA chip which includes RAM blocks according to the present invention.

FIG. 1A shows an FPGA chip according to the present invention. In the center portion of the chip are a plurality of logic blocks 1, separated periodically by columns of RAM blocks 13. Each RAM block spans the height of four logic blocks 1. (In another embodiment, a RAM block can span fewer or more logic blocks, and columns of RAM blocks need not extend the full height of the FPGA chip.) Along the four edges of the chip are edge blocks 2 which include input/output blocks. Also present on the chip are pads (not shown) for connecting to external pins of a package which holds the chip. The pads connect to edge blocks 2, and each edge block is connected to at least one logic block 1. Also present are RAM edge blocks 4 which connect to RAM blocks 13 and corner blocks 5 which connect to edge blocks 2 and which typically provide certain global signals such as a global clock signal and boundary scan signals. Edge blocks 2, corner blocks 5, and logic blocks 1 are discussed in detail in U.S. Pat. 5,682,107, incorporated herein by reference, and are not again described here.

Group 101 of RAM blocks will be discussed later in connection with FIGS. 6A–6C.

FIG. 1B shows a first embodiment of a RAM block 13 of FIG. 1A, and shows external signal lines or buses connected to RAM block 13. This RAM block includes 2304 memory cells configured as a 256×9 RAM. RAM block 13 is the height of four logic blocks 1. Typically, a logic block 1 must access a RAM block 13 either above or below its own position. Extending into RAM block 13 are four sets of routing lines L0 through L3 from adjacent logic blocks, one set of lines associated with each row of adjacent logic blocks. To facilitate access to RAM blocks above or below these horizontal lines, dedicated vertical lines carry address and data signals to the RAM blocks. Address bus ADDR, data-in bus DIN, and data-out bus DOUT extend vertically through the RAM block and programmably connect to the next adjacent RAM block. Also, extending vertically into RAM block 13 are global and local clock lines GCLK and CLK, write enable line WE, and block enable line EN. Global clock line GCLK is permanently connected to RAM blocks throughout the chip and other lines are programmably connectable to the RAM block above.

FIG. 1C shows a second embodiment of a RAM block 13 of FIG. 1A. In FIG. 1C, no enable line EN is provided. Instead the routing of the data-in and data-out lines makes an enable line unnecessary. Instead of a write enable line, the embodiment of FIG. 1C includes a write enable bus 33, in one embodiment 4 lines wide. In both FIG. 1B and FIG. 1C, separate data-in and data-out buses are provided.

In the FIG. 1B embodiment, the data-out buses of several RAM blocks can be connected together, in which case the same lines receive data out signals from several RAM blocks. Contention is avoided by activating the enable signal for only one commonly connected RAM block at one time. In FIG. 1C, several RAM blocks can be connected together and contention is avoided by staggering or rotating the data line connections so that signals to or from the several RAM blocks do not appear on the same line. The RAM block of FIG. 1C includes 4096 memory cells which can have four different internal configurations 4096×1, 2048×2, 1024×4, and 512×8, whereas the RAM block of FIG. 1B has one internal configuration 256×9. Other configurations are possible. For efficiency, the width options in FIG. 3 should be powers of 2 whereas in FIG. 1B, any width may be used. Detail of FIG. 1B is discussed below in connection with FIG. 2. Detail of FIG. 1C is discussed below in connection with FIGS. 7A–7C.

Figure 2:
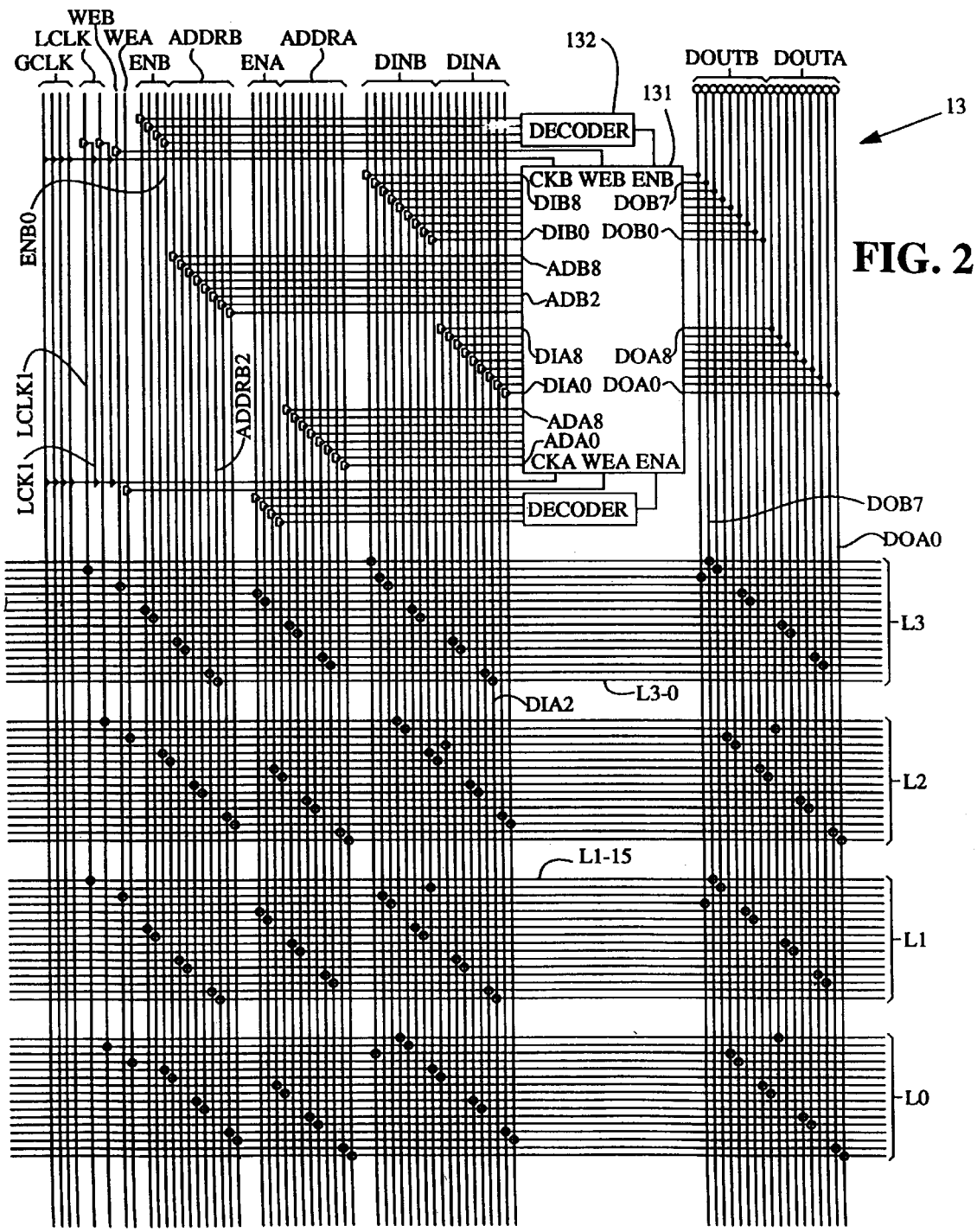
FIG. 2 shows the internal connections of the RAM block of FIG. 1B, including a RAM.

First Embodiment, FIG. 2

FIG. 2 shows in detail dual port RAM block 13 of FIG. 1B. This RAM block includes a dual port RAM 131. A dual port RAM provides two independent sets of address, data, and control lines for accessing the same memory locations. A dual port RAM is useful when a user wants to read or write to two addresses in the same memory at the same time. For example, a FIFO which receives bursts of data from an external source and stores the data for internal processing makes good use of the dual ports, using one port for being written to from the external source and the other for being read by internal logic.

In FIG. 2, as in FIG. 1B, extending horizontally in dual port RAM block 13 are four sets of local interconnect lines L0 through L3 which connect to adjacent logic blocks. Extending vertically in dual port RAM block 13 are the address, data, and control lines of the RAM block. Four global clock lines GCLK connect permanently to RAM blocks above and below the illustrated RAM block 13. Two local clock lines LCLK connect programmably to RAM blocks above and below. Both clock lines GCLK and LCLK connect programmably to RAM 131. The programmable connections shown at the top edge of FIG. 1B are represented by pentagon symbols to the left of RAM 131. The pentagon symbol is discussed below in connection with FIG. 4A. Write enable lines WEA and WEB and address enable buses ENB and ENA connect programmably to RAM blocks above and below as do address buses ADDRB and ADDRA.

Many configurations of the FPGA are implemented more conveniently with separate data-in and data-out lines because an interconnect line must be driven from a single source, and if a RAM must have tristate control on all data output drivers, it may be difficult to route a signal for providing the tristate control to the RAM. Thus it is preferable for data-in and data-out signals not to share the same line. Therefore, dual port RAM block 13 includes both data-in buses DINB and DINA for writing to RAM 131 and data out buses DOUTB and DOUTA for reading from RAM 131. These data buses are connectable to RAMs above and below the one shown. In one embodiment the LCLK, WEA, WEB, ENA. and ENB lines and the ADDRA, ADDRB, DINA and DINB buses use buffered connections (represented by pentagons and discussed below), and the DOUTA and DOUTB buses use unbuffered connections (represented by open circles).

Figure 3A:
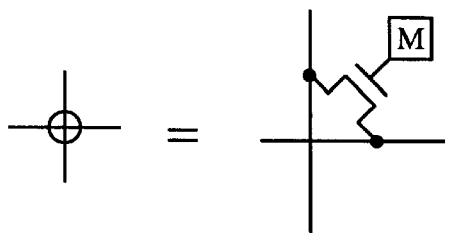
FIGS. 3A–3D illustrate some of the symbols used in FIGS. 2 and 7A.
Figure 3B:
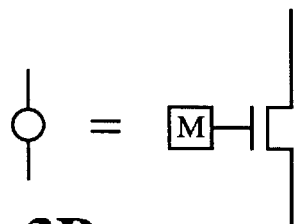

FIG. 3A illustrates that the circle surrounding an intersection of two lines represents a pass transistor controlled by a memory cell M for connecting the two lines. FIG. 3B illustrates that the open circle joining two line segments also represents a pass transistor controlled by a memory cell for connecting the two line segments.

Figure 3C:
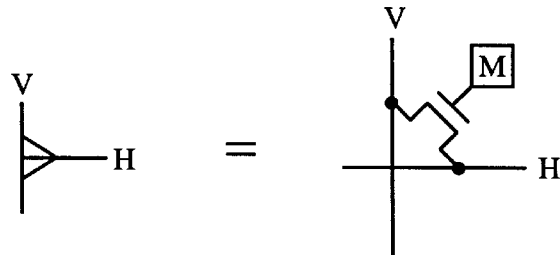

FIG. 3C illustrates that the triangle pointing in the direction of one line segment represents a programmable connection which applies a signal from the line at the flat edge of the triangle onto the line pointed to by the triangle. (The signal is of course then present on the full length of the line. A triangle pointing in the opposite direction would have the same meaning since it would point to the same wire.) Where signal flow is always in the same direction, the triangle symbol assists the reader with following the flow of signals. A simple pass transistor can make the connection, as shown in FIG. 3C.

Figure 3D:
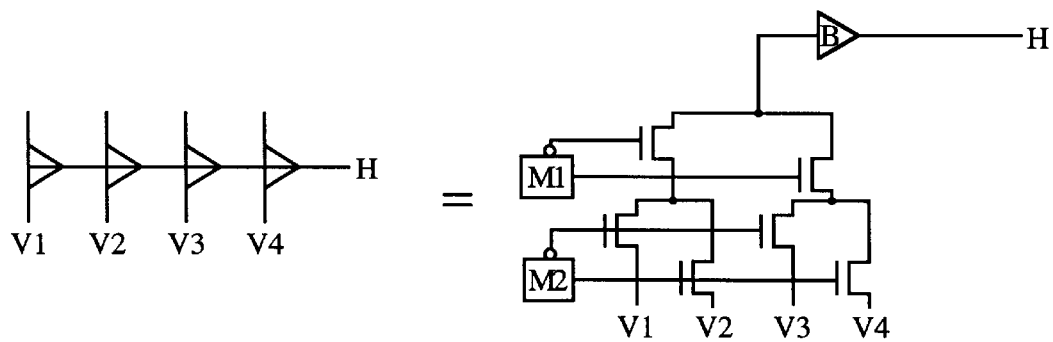

When one line is accessed by several programmable connections, these are frequently implemented as a multiplexer. FIG. 3D shows four vertical lines V1 through V4 that can each place a signal onto horizontal line H. Only one of these programmable connections is used at one time. As shown at the right of FIG. 3D, two memory cells M1 and M2 select which of vertical lines V1 through V4 is connected through buffer B to horizontal line H.

Bidirectional Buffer

Figure 4A:
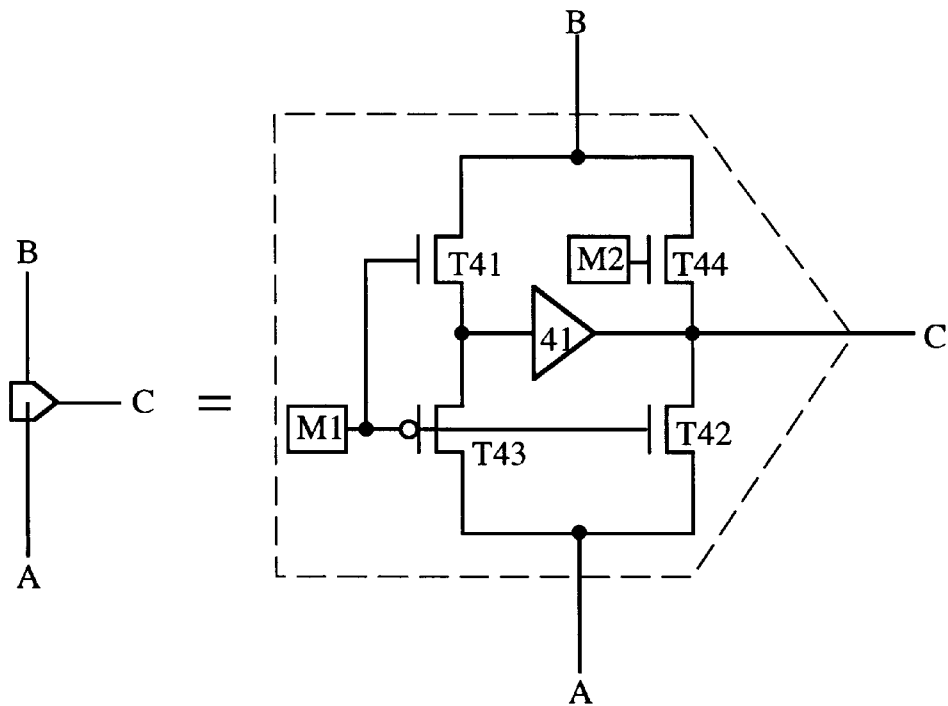
FIGS. 4A and 4B illustrate bidirectional buffer symbols used in FIGS. 1B, 1C and 2, and a related bidirectional buffer usable with the present invention.

FIG. 4A illustrates that the pentagon between line segments A and B which is partly covered by line segment A is a bidirectional buffer, and illustrates another aspect of the buffer in which the bidirectional buffered connection between line segments includes a default input from line A to the buffer when the buffer is in a tristate mode.

As shown in FIG. 4A, the bidirectional buffer includes one buffer element 41. Two memory cells M1 and M2 control the direction of signal flow and whether the buffer is in a tristate mode. When M1 and M2 both hold logical 0, the buffer is in a tristate mode, driving neither of line segments A or B. But P-channel transistor T43 is on, and therefore the signal on line segment A is applied to the input terminal of buffer 41. This buffer is further described by Young in U.S. Pat. No. 5,517,135, incorporated herein by reference.

RAM Block

Returning to FIG. 2, dual port RAM block 13 and connections to dual port RAM memory 131 will now be explained. Dual port RAM block 13 can be connected to the four rows of logic blocks in which RAM block 13 is positioned. Sets of local interconnect lines L0–L3 make programmable connections to logic blocks in the four respective rows spanned by RAM block 13. In addition, RAM 131 can be connected to lines L0–L3 in RAM blocks above or below the one shown.

Programmable connections such as shown by the pentagon symbol in FIG. 4A appear in FIG. 2. As shown by the pentagons, each of the input signals to RAM 131 in FIG. 2 is buffered by a buffer element 41 (FIG. 4A) which is positioned at an intersection of horizontal and vertical lines in RAM block 13 (FIG. 2). Thus the horizontal lines extending to the left edge of RAM 131 are buffered versions of the signals on vertical lines in FIG. 2 to which the horizontal lines connect. Whether the source of a signal driving RAM 131 is above or below the horizontal line depends upon what value is in memory cell M1 (FIG. 4A). Signals which drive input terminals to RAM 131 can be derived from horizontal lines L0 through L3 or they can be derived from RAM blocks above or below the one shown in FIG. 2.

For example, in FIG. 2, in the row of logic blocks accessed by lines L3, line L3-0 can serve as a data-in line and be programmably connected to DINA bus line DIA2. Alternatively, line L3-0 can serve as an address line and be programmably connected to ADDRB line ADDRB2 as indicated by the circle at the intersection of line L3-0 with line ADDRB2. Line ADDRB2 is buffered by a bidirectional buffer to drive line ADB2. Programmable connections represented by pentagons are illustrated in FIG. 4A and discussed above.

Similarly, line L1-15 can serve as a local clock line driven by a logic block in the row accessed by lines L1 and be programmably connected to local clock line LCLK1, which is connected by a bidirectional buffer to line LCK1. Line LCK1 can in turn be connected to clock input terminal CKB or CKA of either the B or the A port of RAM 131. Programmable connections represented by the triangles at the intersection of line LCK1 and the two clock input lines CKA and CKB to RAM 131 are illustrated in FIG. 3C and discussed above.

Alternatively, line L1-15 can serve as a data-out line and be programmably connected to DOUTB line DOB7.

These and other programmable connections are indicated by circles, triangles and pentagons at the respective intersections.

Pipulation

The term PIP stands for programmable interconnection point. The term pipulation stands for PIP population. Many arrangements of pipulation are possible. Where it is desired to minimize chip area, fewer PIPs are provided (sparser pipulation), and the locations of the PIPs are selected to provide the greatest flexibility and speed for common uses of the structure. If the PIPs are formed from very small devices such as EPROM cells or antifuses, PIPs may be provided at many intersections to increase flexibility. In general, pipulation must be sufficient and the number of local interconnect lines must be sufficient that a user can access all address, data, and control lines used in a configuration. In wide memories, since data lines are not shared, there must be an access point for each data track, as will be discussed in connection with FIGS. 6A–6C. When data lines will be used by vertically adjacent RAM blocks, they can not be vertically connected, and sufficient pipulation must be provided to connect the vertical data lines to horizontal interconnect lines in the same RAM block.

Decoder Blocks

Figure 5:
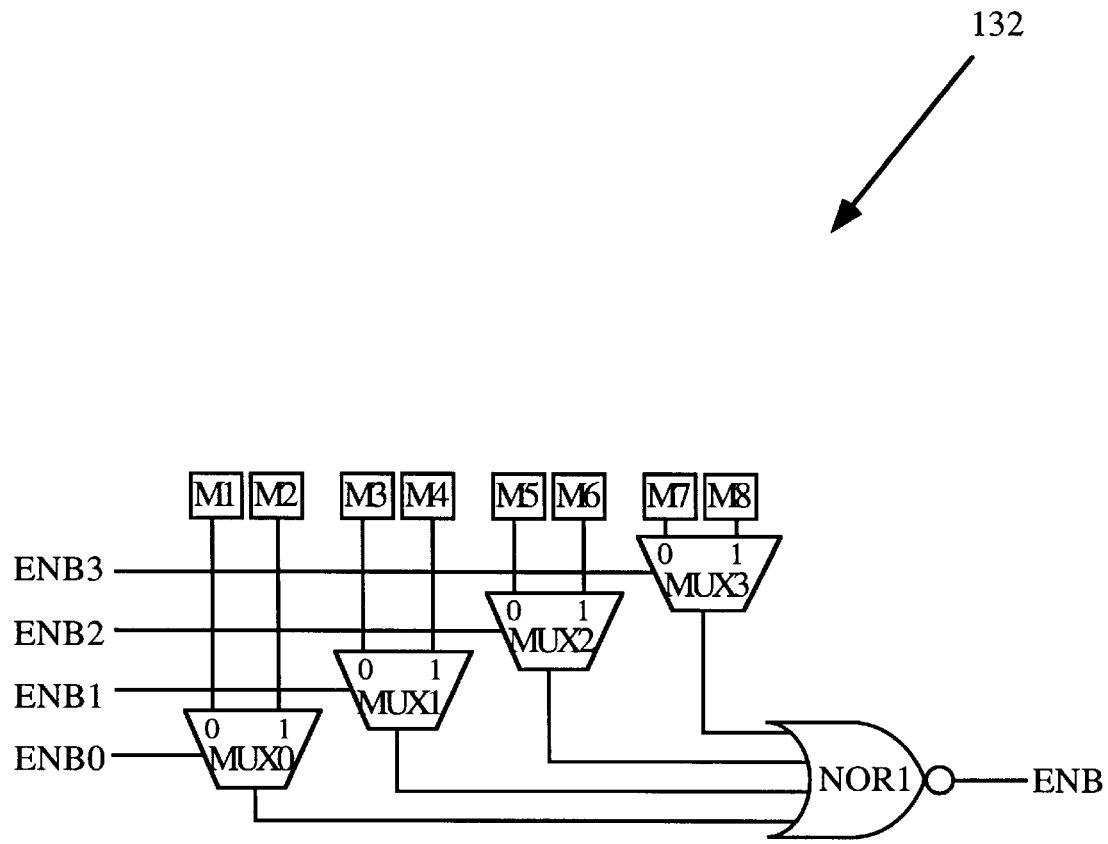
FIG. 5 shows one embodiment of a decoder according to the present invention which may be used in the RAM block of FIG. 2.

Decoder blocks 132 and 133 of FIG. 2 may be formed as shown in FIG. 5. In FIG. 5, decoder block 132 comprises four two-input multiplexers MUX0–MUX3. Each multiplexer is controlled by an enable line ENB0–ENB3 which can in turn be accessed from a line in two of the horizontal lines L0 through L3. In the embodiment of FIG. 5, eight memory cells M1–M8 provide the inputs to the four two-input multiplexers MUX0–MUX3. (In another embodiment not shown, the eight multiplexer inputs are routed from neighboring logic blocks as are the four multiplexer control input signals shown in FIG. 2.) The decoder output signal ENB which controls RAM 131 (FIG. 2) is generated by NOR gate NOR1 (FIG. 5) in response to the output signals from the four multiplexers MUX0 through MUX3.

Decoder blocks 132 and 133 allow enable lines in buses ENB and ENA to be used as additional address lines or to be ignored. These blocks can also be used to disable the entire RAM port. The arrangement of FIG. 5 gives great freedom to the FPGA user. Regarding port B, the user can pair two vertically adjacent RAM blocks 13 and use decoder 132 in each block to select between the two of them. Such an arrangement requires only one of the four input lines to decoder block 132. For example, in the two adjacent RAM blocks, multiplexers MUX1 through MUX3 are caused to ignore their respective control signals by loading logical 0's into memory cells M3 through M8. In one of the two RAM blocks, memory cells M1 and M2 are loaded with 01 and in the other, memory cells M1 and M2 are loaded with 10. In this configuration, a logical 0 applied to line ENB0 selects the RAM block configured with 01, and a logical 1 selects the RAM block configured with 10.

Placing 11 into any pair of multiplexer inputs, for example M1 and M2, causes NOR gate NOR1 to provide a logical 0 output signal and thus disables the B RAM block port. This allows the four enable lines to route signals to or from locations above or below the block shown.

Placing 00 into any pair of multiplexer inputs causes that multiplexer to be a don't-care and causes decoder 132 to ignore the signal on the control input of that multiplexer. For example, placing 00 into memory cells M1 and M2 causes multiplexer MUX0 to be a don't-care and allows line ENB0 to be used for routing signals elsewhere while allowing decoder 132 to respond to other enable signals.

In this situation, placing 01 01 01 into the three pairs of memory cells M3–M8 respectively causes decoder 132 to be enabled in response to the address 000 on enable lines ENB1–ENB3. The values 01 in a pair cause the respective multiplexer to forward the control signal to the output. The values 10 in a pair cause the multiplexer to forward the complement of the control signal to the output. Eight RAM blocks 13 can be separately addressed by placing different permutations of 0 and 1 into the three pairs of multiplexer inputs in memory cells M3–M8 of the eight RAM blocks 13 and placing the address on lines ENB1–ENB3. And of course, sixteen RAM blocks can be addressed by using all four enable lines.

A default value of 11 11 11 11 loaded into the eight memory cells M1–M8 disables the RAM so that no power is consumed and no contention occurs in response to any configuration of other parts of RAM block 13.

Although FIG. 5 illustrates a NOR gate for generating the control output signal ENB, an OR, NAND or AND gate can be used just as well, with different values in memory cells M1–M8 achieving the desired result. For example, if an AND gate were used, the default value would be 00 00 00 00. Different values on enable lines ENB1–ENB3 would also be used to produce the desired result.

In one embodiment, a disabling decoder output signal (for example a logical 0 from NOR gate NOR1) also causes all output signals from that port (for example all signals from RAM 131 which drive DOUTB bus lines DOB0–DOB8) to be tristated. This allows lines DOB0–DOB8 to be driven by another RAM 131 above or below the one shown. However, tristating also makes it possible for lines DOB0–DOB8 (and other data out lines) to be left floating when no RAM output signals are driving the lines. Thus small keeper circuits or pull-up resistors are attached to these lines.

FIG. 4B

Figure 4B:
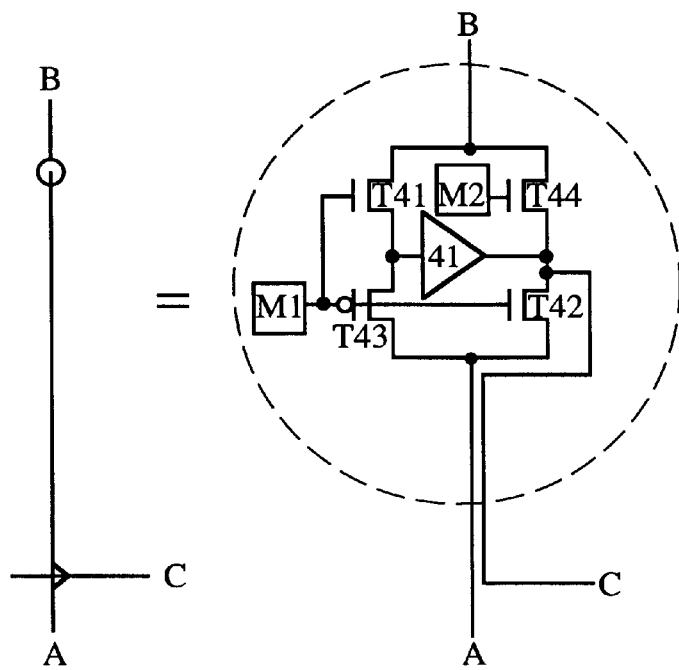

If several copies of FIG. 1B or FIG. 2 are placed vertically adjacent to each other, the lines or circles at the top of one copy will join straight lines at the bottom of another copy. Line B in the symbol of FIG. 4B is in the upper copy (or block) and line A and the circle in the symbol of FIG. 4B are in the lower copy. The combination of a triangle and an open circle with a line to its center shown at the left of FIG. 4B indicates a bidirectional buffer with default input shown at the right of FIG. 4B. This is the same circuit shown in FIG. 4A, and is not explained again. Part of the symbol of FIG. 4B appears in FIGS. 6A–6C, discussed below. The symbol of FIG. 4B also appears in FIGS. 7A–7C below.

RAM Block Grouping and Memory Length/Width Control

FIG. 6A illustrates a RAM block group 101 including four adjacent RAM blocks 13-5 through 13-8, each structured as shown in FIG. 2. Other numbers of RAM blocks can also be used together. RAM block group 101 is also illustrated in FIG. 1A. Each RAM block spans four logic blocks so the four RAM blocks in group 101 span 16 logic blocks. The four adjacent blocks can be configured as a 1024×9 RAM, a 512×18 RAM, or a 256×36 RAM. Each RAM block includes a RAM 256×9, that is, a RAM having a depth of 256 words, each word having a width of 9 bits. The 9-bit word is used in this embodiment instead of an 8-bit word because many users want a parity bit, and getting a parity bit with only 8-bit words is awkward. Providing the 9th bit when unused is not so expensive since the 9th bit shares the decode logic of the other 8 bits and the 12% increase in memory area produces a small increase in total area. In this embodiment, width (word length) and length (number of addresses) depend on how you turn on the bidirectional buffers and pass gates between adjacent RAM blocks 13. FIGS. 6B and 6C illustrate alternative configurations of RAM block group 101.

In FIG. 6A, the four RAM blocks 13-5 through 13-8 are configured as a 1024×9 memory. For 1024×9, there must be 10 address bits. The ADDR bus (buses ADDRA and ADDRB in FIG. 2) has 8 bits. As shown in FIG. 6A, the four adjacent ADDR buses in the four adjacent RAM blocks 13-5 through 13-8 are connected together. The eight address bits in the ADDR bus (or 16 on dual address buses ADDRA and ADDRB of FIG. 2) address the 256 words ($2^8$) inside RAMs 131. Since four locations, one in each RAM 131 are addressed by the same 8-bit address on BUS ADDR, two enable lines EN (ENA or ENB in FIG. 2) are also used as address bits and connected together to provide the 9th and 10th address bits as discussed above in connection with FIG. 5. The data-in and data-out lines in one RAM block are connected to the corresponding data-in and data-out lines in the adjacent RAM blocks since only one RAM in the four RAM blocks will be addressed at any one time. The data placed onto the data-out line may be picked up at a local horizontal line at several places along the four RAM blocks (or 16 logic blocks). The write enable WE and local clock LCLK lines are also connected together to group the four RAM blocks together. Black dots indicate buses having lines in adjacent blocks which have been connected through bidirectional buffers or pass gates, and clear circles indicate lines which have not been connected through bidirectional buffers or pass gates. Note at the top and bottom of FIG. 6A, the bidirectional buffers and pass gates show disconnected lines from the next RAM block above, whereas interior to the group of four, all pairs of lines in adjacent RAM blocks have been connected.

As shown in FIG. 6B, to form a 512×18 memory, the data lines of the four RAM blocks are divided into two groups as indicated by the open circles PIN2 and POUT2 while the address, enable, write-enable, and local clock lines remain together. Only one of the enable lines is used as an address line, the others being ignored by the don't-care configuration of the decoder discussed above in connection with FIG. 5. So two RAM cells, for example one RAM cell in RAM block 13-5 and one RAM cell in RAM block 13-7, are accessed in response to one 9-bit address. For reading, the two addressed RAM cells each place their 9 bits of data onto the data-out buses DOUT simultaneously. For writing, the two addressed RAM cells each take their 9 bits of data from the data-in buses DIN simultaneously. The data-in and data-out lines are split at the middle at PIN2 and POUT2 into two groups. Horizontal data lines in each of the upper and lower groups read and write data, and since the data lines are split there is no contention. The data bits stored in the upper two RAM blocks must be detected on horizontal lines connected to the upper two RAM blocks 13-5 and 13-6 and the lower bits must be detected on the lower lines connected to RAM blocks 13-7 and 13-8. In this example, addresses may come from logic block locations adjacent to any of the four RAM blocks or even from more distant locations which can be connected to the horizontal lines shown. In another example, bus ADDR in RAM block 13-5 may be connected to the address bus above (not shown), in which case the address may be derived from logic blocks even farther from the addressed RAM blocks. Thus in response to one 9-bit address, 18 data bits are written or read. 512 distinct locations are addressed by the 9-bit address, so the memory is 512×18.

As shown in FIG. 6C, for a 256×36 memory, the data input and output lines of the four RAM blocks are separated into four groups while the address lines ADDR are connected together. In this configuration, only 8 address lines are used. The enable lines are not used for addressing. Thus four RAM blocks place a data word onto a data-out bus or read a data word from a data-in bus in response to a single address. The four sets of data must then be detected or provided by logic blocks in the regions of the respective RAM blocks.

Dual Port RAM Configurations

Since each 256×9 RAM is a dual port RAM, it can be configured as two separate single-port 128×9 RAMs, or as one single-port 128×18 RAM. Recall that all 256×9=2304 RAM bits are addressable from both address buses.

To form two 128×9 RAMs, one of the eight address bits, for example the most significant address bit, is permanently set to one state on the address bus for one port and the other state for the other port. This causes half the RAM to be addressed by the seven remaining bits on one address bus and half by the seven bits on the other address bus. The least significant seven address lines of one address port are connected to one set of seven vertical address lines and the least significant seven address lines of the other address port are connected to another set of seven vertical address lines. The data-in ports are connected to separate data-in lines and the data-out ports are connected to separate data-out lines.

To form one single-port 128×18 RAM, the most significant bit in one address port is connected to the enabling voltage source, for example logical 1 and the most significant bit in the other address port is connected to ground. The remaining seven address lines from the two ports are connected to the same seven vertical address lines. Thus any address on the seven vertical address lines addresses two sets of RAM cells. The eighteen vertical data-out lines are connected to the eighteen data-out lines of the two ports and thus receive the contents of the two sets of addressed RAM cells, which then comprise a single 18-bit word.

Figure 7A:
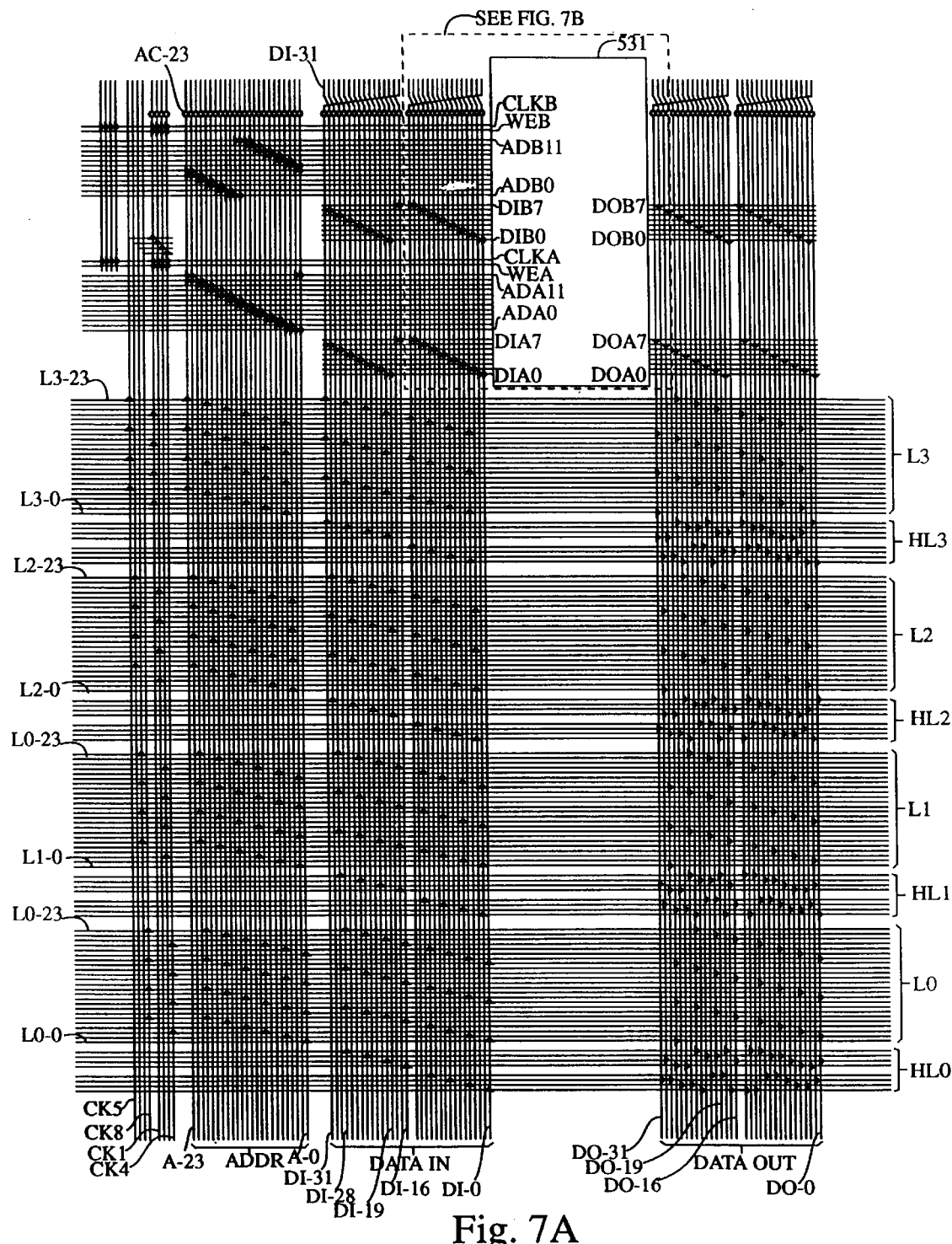
FIG. 7A shows the internal connections of the RAM block of FIG. 1C.
Figure 7B:
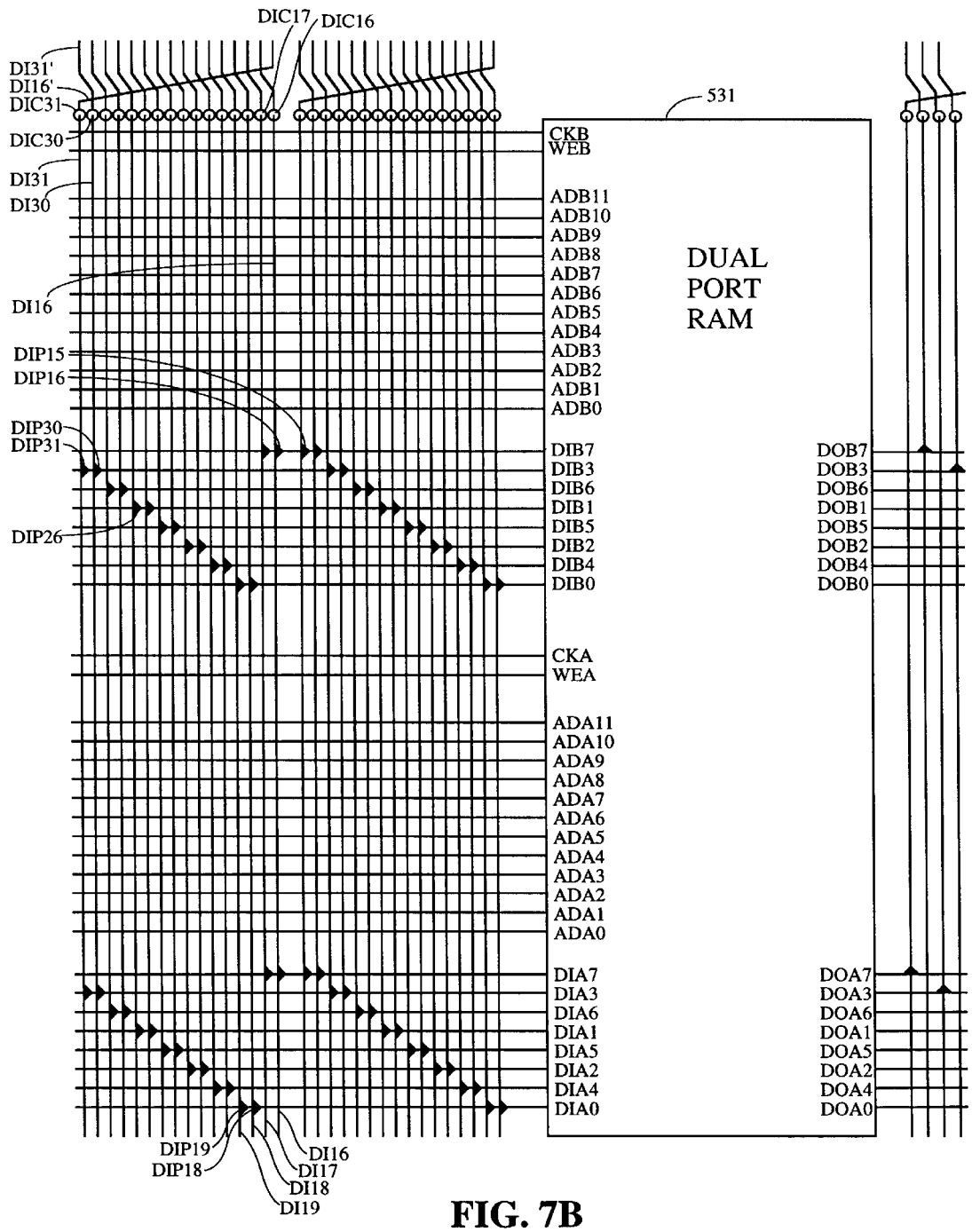
FIGS. 7B and 7C show enlargements of portions of FIG. 7A near RAM 531.
Figure 7C:
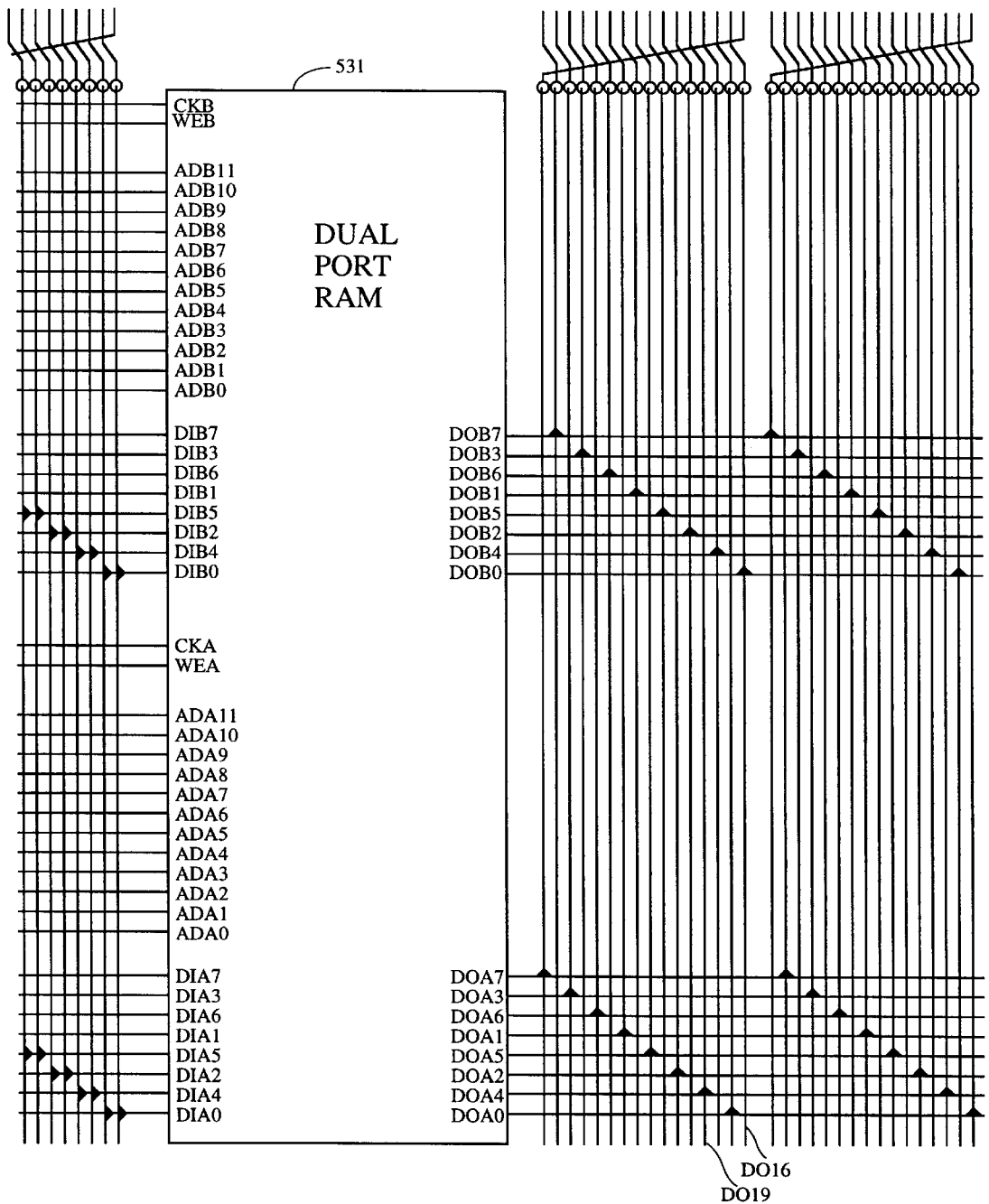

Second Embodiment. FIGS. 7A–7C

A second embodiment of the RAM block of the invention is shown in FIGS. 7A–7C. The RAM block of FIG. 7A includes RAM 531 and lines for connecting RAM 531 to other portions of the chip. RAM 531 is configurable to four different configurations: 4096×1, 2048×2, 1024×4, and 512×8. Horizontal lines extend left from RAM 531. These provide address, data-in, and control signals to RAM 531. Horizontal lines extending to the right from RAM 531 receive data-out signals from RAM 531. As in FIG. 2, dedicated vertical lines extending through the RAM block of FIG. 7A provide the interface between logic blocks of the FPGA chip and the RAMs 531 in the RAM blocks of the chip. As in FIG. 2, programmable connectors at the top of the figure allow the RAM block of FIG. 7A to connect to an identical RAM block above. The internal configurations of RAM 531 may be controlled in a manner similar to that discussed above in connection with FIGS. 6A–6C, by well-known methods, or by the novel structure described by Nance et al. in co-pending application Ser. No. 08/687,902 filed Jul. 29, 1996.

As in FIG. 2, four groups of horizontal lines in sets L0 through L3 extend through the RAM block of FIG. 7A. These lines are part of the general interconnect structure for the logic blocks of the FPGA chip. Programmable connectors allow these horizontal lines to be connected to the vertically extending address, data-in, data-out, and control lines. In the embodiment of FIG. 7A, longer horizontal lines HL0 through HL3 carry data-out signals to logic blocks farther away. The unlabeled triangles at selected intersections of horizontal and vertical lines allow programmable connections at the intersections. As discussed in connection with FIG. 4B, the combination of a triangle and an open circle with a line to its center indicates a bidirectional buffer with default input. In FIG. 4B or FIGS. 7A–7C, the circle can be thought of as a programmable buffered connection to a RAM block above or below the figure. The triangle (with circle above) can be thought of as a programmable buffered connection into RAM 531.

Difference Between Embodiments

There is a basic difference between the embodiments of FIG. 2 and FIGS. 7A–7C. In FIG. 2, data-out lines from several RAMs are connected to the same vertical data-out lines, and in a deep configuration (1024×9 shown in FIG. 6A for example) several RAM blocks may be connected to the same line. Contention is avoided by using the enable lines to avoid placing more than one signal onto a data-out line at one time.

In the embodiment of FIGS. 7A–7C, there are no enable lines. Contention is avoided by staggering the data-in and data-out lines. At the tops of FIGS. 7A–7C, programmable connectors, such as DIC31 and DIC30 labeled in FIG. 7B, connect to lines extending into the RAM block above.

Looking at FIG. 7B, data-in line DI30 connects through programmable data-in connector DIC30 to data-in line DI31', which continues as line DI31 in the RAM block above. Left-most line DI31 connects through programmable data-in connector DIC31 to line DI16', which continues as line DI16 in the RAM block above. Other lines are staggered by lines above their respective programmable connectors to move left in the RAM block above. The same staggering arrangement occurs for the data-out lines to the right of RAM 531. Looking at both FIGS. 7A and 7B, one can see that the top line L3-23 (FIG. 7A) of lines L3 can be programmably connected to vertical line DI31 and programmably connected through data-in PIP DIP31 (FIG. 7B) to data-in line DIB3 in RAM 531. Alternatively or additionally, the RAM above RAM 531 may be used by setting programmable connector DIC31 to conduct signals upward, thereby connecting line DI31 to line DI16', which continues as line DI16 in the RAM block above. Line DI16 can be seen in FIG. 7B to connect through PIP DIP16 to data-in line DIB7. Thus line DI31 can connect to data-in line DIB3 in the RAM block shown or to line DIB7 in the RAM block above.

Separation of Staggered Lines for Maximum Flexibility in all RAM Configurations

Note the numbering of the data-in and data-out lines in FIGS. 7B and 7C. The data-in and data-out lines in RAM 531 are numbered according to which bit is most significant, bit 7 being most significant and bit 0 being least significant. The numbering is not consecutive. (Of course the illustration could have been drawn with consecutive numbering and a correspondingly different pattern of PIPs external to RAM 531.) The PIPs and staggered vertical lines are arranged so that x1, x2, x4, and x8 RAM memories can all be accessed through the vertical lines with no contention over the largest possible span of vertically adjacent RAM blocks for the number of vertical data lines provided. For a x1 RAM, that is, when RAM 531 has been configured with one bit in a data word, only the D0 line is used (for example lines DIA0, DIB0, DOA0, and DOB0) and the vertical line which connects to a particular horizontal D0 line does not connect to that same vertical line until 16 RAM blocks have passed. For a x2 RAM, that is, when RAM 531 has been configured with 2 bits in a data word, only lines D0 and D1 are used. These are separated from each other by the staggering structure at the top of FIGS. 7A–7C so that a D0 line does not conflict with a D1 line until 8 RAM blocks have passed. Similarly, for a x4 RAM, lines D0, D1, D2, and D3 are used and don't conflict until four RAM blocks have passed. Finally, for the x8 configuration, all the horizontal data lines are used. Since there are 8 horizontal data lines and 16 vertical data lines, the configuration can be arranged so that even when eight data lines are used there is no conflict until 2 RAM blocks have passed.

In the embodiment of FIG. 7A, a x1 memory is assumed to use only the 0th data ports. However, in another embodiment, a RAM block in a x1 memory configuration can place a single signal onto several or all data ports, and thereby increase the routing flexibility without increasing the space required for pipulation. Similarly, a x2 configuration can use more than two data ports and a x4 configuration can use more than four data ports.

Pipulation

Looking at FIG. 7A, a regular pattern of PIPs allows interconnect lines L0 through L3 to access RAM block 531 as well as other RAM blocks above and below the figure. Lines in sets L0 through L3 can serve as address or data lines. For example, line L3-23 in set L3 can be used as an address line by turning on the PIP at the intersection of line L3-23 and vertical address line A23. Vertical address line A23 can in turn access horizontal A-port address line ADA11 or horizontal B-port address line ADB11 by turning on the PIP at the intersection of those two lines. Vertical address line A23 can be connected to another vertical address line A23 in the RAM block above the figure by turning on connector AC23 at the top of the figure and this vertical address line can in turn be connected to horizontal address lines such as shown in FIG. 7A. Thus, line L3-23 can access many different horizontal address lines in many different RAM blocks. Each of the lines L3-0 through L3-23 in set L3 can access one of the horizontal address lines leading to RAM 531.

The PIPs for connecting set L2 to vertical address bus ADDR are offset from corresponding PIPs for set L3. PIPs for sets L1 and L0 are likewise offset. The four sets L0 through L3 can each access all horizontal address lines ADA11–ADA0 in the A-port and all horizontal address lines ADB11–ADB0 in the B-port through vertical address bus ADDR, though different vertical address lines are used by the four sets of lines L0–L3 because the offset of PIPs is different for the four sets of lines L0–L3. For example, in set L3, line L3-23 can access horizontal address lines ADA11, ADA10, ADB4 and ADB5. In set L2, line L2-23 can access the same horizontal address lines as line L3-23 but through vertical address line A22. Lines L2-23 and L1-23 access horizontal address lines ADA10, ADA9, ADB4 and ADB3 through vertical address lines A21 and A20 respectively.

Lines in sets L0–L3 can also serve as data-in or data-out lines. For example, line L3-23 in set L3 can be used as a data-in line by turning on the PIP at the intersection of line L3-23 and vertical data-in line DI31 and turning on one or more PIPs at the intersections of vertical data-in line DI31 and horizontal data-in lines DIB3 and DIA3 (see labeling in FIG. 7B).

Note that line L3-23 can not serve as a data-out line from the B-port of RAM 531 in FIG. 7A. Though a PIP is present at the intersection of line L3-23 and vertical data-out line DO27, no PIP is present at the intersection of vertical data-out line DO27 and any horizontal data-out lines from the B-port of RAM 531. However, line L3-23 can serve as a data-out line from the B-port of the corresponding RAM 531 above FIG. 7A. Turning on connector DOC31 (see FIG. 7C) connects vertical data-out line DO31 to data-out line DO16', which continues as data-out line DO16 in the RAM block above the figure. As can be seen in FIG. 7C, vertical data-out line DO16 can receive data from horizontal data-out line DOB0 by turning on the PIP at that intersection. Other patterns of PIPs allow other options. As discussed above, a more dense pipulation gives more options but requires more chip area to implement.

Dual-Port RAM Feature

With the separate data-in and data-out lines, some logic blocks can read RAM 531 through port B while other logic blocks are writing to RAM 531 through port A. Notice that 24 vertical address lines A0–A23 are provided and that in a 4096-deep configuration 12 address lines are used. For example, if the odd-numbered ones of address lines A0–A23 are used for writing to data-in port A, then the even numbered address lines can be used for reading from data-out port B. (Any mixture of lines can be used for ports A and B as long as there are sufficient lines and sufficient PIPs.)

For writing to port A and reading from port B in the 4096×4 RAM, four data bits will be written to vertical data-in lines DI0 through DI3 by turning on four pairs of PIPs. One PIP will be turned on at the intersection of horizontal line L3-20 and vertical data-in line DI19, a second PIP at the intersection of horizontal line L2-20 and vertical data-in line DI18, a third at the intersection of horizontal line L1-20 and vertical data-in line DI17, and a fourth at the intersection of horizontal line L0-20 and vertical data-in line DI16.

To complete the paths, PIP DIP19 in RAM 531 is turned on to connect line L3-20 to data-in port DIB0. Thus, the signal on line L3-20 is received on line DIA0 in RAM 531, and written by well-known means to the addressed memory cell in RAM 531. PIP DIP18 is not turned on. Thus, the signal on line L2-20 is not connected to line DIA0 in RAM 531. However, in an identical RAM block above, PIP DIP19 is turned on, thus the signal on line L2-12 is received on line DIA0 in the RAM above RAM 531. The signal on line L1-20 which is placed on vertical data-in line DI17 is connected by connector DIC17 to vertical data-in line DI18 in the RAM block above FIG. 7A and further through a connector DIC18 in the RAM block above FIG. 7A to a vertical data-in line DI19 in the RAM block two above FIG. 7A. From there it connects through a PIP DIP19 to a horizontal data-in line DIA0 and into the RAM two above FIG. 7A. Similarly, the signal on line L0-20 which is placed on line DI16 in FIG. 7A is connected to a horizontal data-in line DIA0 in the RAM block three above FIG. 7A.

Thus four bits of a data word which are placed onto lines L3-20, L2-20, L1-20, and L0-20 by logic blocks adjacent the RAM block of FIG. 7A are written into memory cells in four different RAM blocks, three of which are above FIG. 7A.

In each of four RAM blocks, only horizontal data-out line DOB0 is used. This results in four data-out signals being placed onto vertical data-out lines DO16 through DO19 of FIG. 7C or FIG. 7A. Although PIPs are present at the intersections of these four lines and horizontal lines L3-20, L2-20, L1-20, and L0-20, these four horizontal lines can not be used for reading because they are already being used for the writing operation described above. However, PIPs are also present at intersections with lines L3-14, L2-14, L1-14, and L0-14 and these lines can be used for writing by turning on the respective PIPs.

Example Applications of RAM Block of FIGS. 7A–7C

RAM 531 is a dual-port RAM with four configurations. RAM 531 contains 4096 memory cells, which can be configured by well known internal structures as a 4096×1 RAM, a 2048×2 RAM, a 1024×4 RAM or a 512×8 RAM. There are 24 horizontal address lines, 12 for each port, in the embodiment of FIG. 7A.

In a 4096×1 configuration, 12 horizontal address lines address each port ($2^{12}$=4096). In the 4096×1 configuration, only horizontal data-in lineS DIA0 AND DIB0 and horizontal data-out lineS DOA0 and DOB0 are used.

In a 2048×2 RAM configuration, 11 horizontal address lines address each port ($2^{11}$=2048), leaving the most significant address bit for each port unused. Two data-in lines for each port DIA0, DIA1, DIB0, and DIB1 and two data-out lines for each port DOA0, DOA1, DOB0 and DOB1 are used.

In a 512×8 RAM, nine address lines for each port, lines ADB8–ADB0 and ADA8–ADA0 are used for addressing. The three most significant address lines are ignored. In the 512×8 configuration, all 8 data lines for each port are used.

Figure 8A:
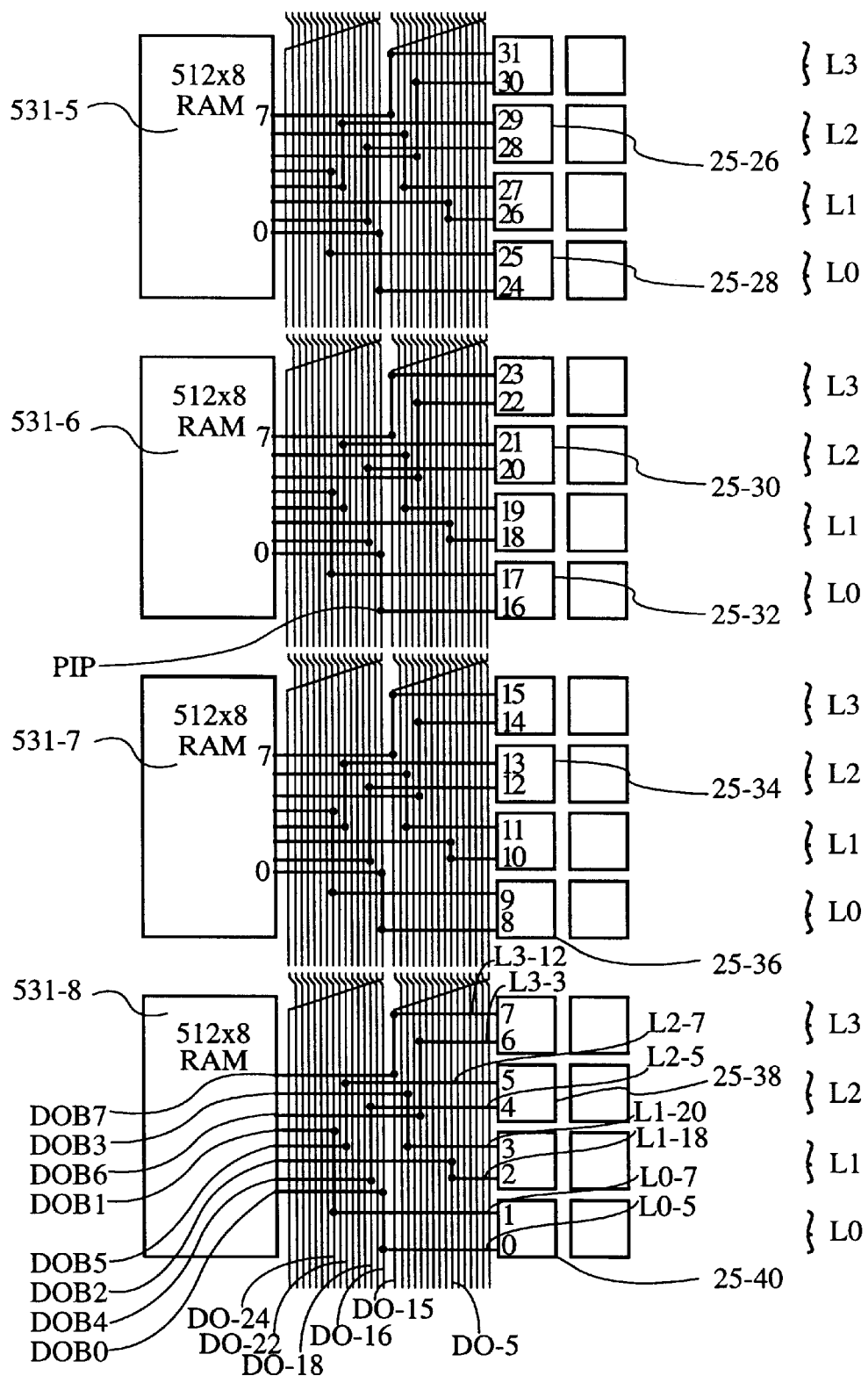
FIGS. 8A–8C represent RAMs configured from four adjacent RAM blocks of the embodiment in FIGS. 7A–7C.

FIG. 8A shows an example application of the embodiment of FIGS. 7A–7C when the RAM blocks are in the 512×8 configuration. Four RAM blocks are used in conjunction. They are configured as a 512×32 RAM. Since the logic that accesses the memory cells in the four adjacent RAM blocks has been placed so that each logic block accesses an adjacent RAM block, the vertical connections from one RAM block to the next are not needed or used. FIG. 8A shows the vertical data-out routing lines within one RAM block being used to carry signals from RAM block output ports to logic block input ports.

Memory cells in RAM block 531-8 store the least significant bits 0 through 7 of each 32-bit word. The output ports DOB0 through DOB7 of RAM block 531-8 are connected to logic blocks in the four rows adjacent to RAM block 531-8 by turning on PIPs to the vertical data-out lines. For simplicity, only the PIP at the intersection of vertical dataout line DO-16 and one of the horizontal lines is labeled. In the example shown, data-out port DOB0 in RAM block 531-8 is connected to vertical data-out line DO-16 by turning on the PIP at the intersection of these two lines. By turning on the PIP at the intersection of vertical line DO-16 and horizontal line L0-5, data-out port DOB0 is connected to line L0-5 to provide the 0 data bit to logic block 25-40. Similarly, dataout port DOB1 is connected to vertical line DO-22, which is in turn connected to line L0-7 of logic block 25-40. The other 30 data bits of the 32-bit word are connected as shown. Additional connections not shown in FIG. 8A allow logic blocks to access vertical address lines and data-in lines as well as to apply clock and other required signals to implement the desired memory functions.

Deeper RAMs That Use Connections Between Vertical Lines

Figure 8B:
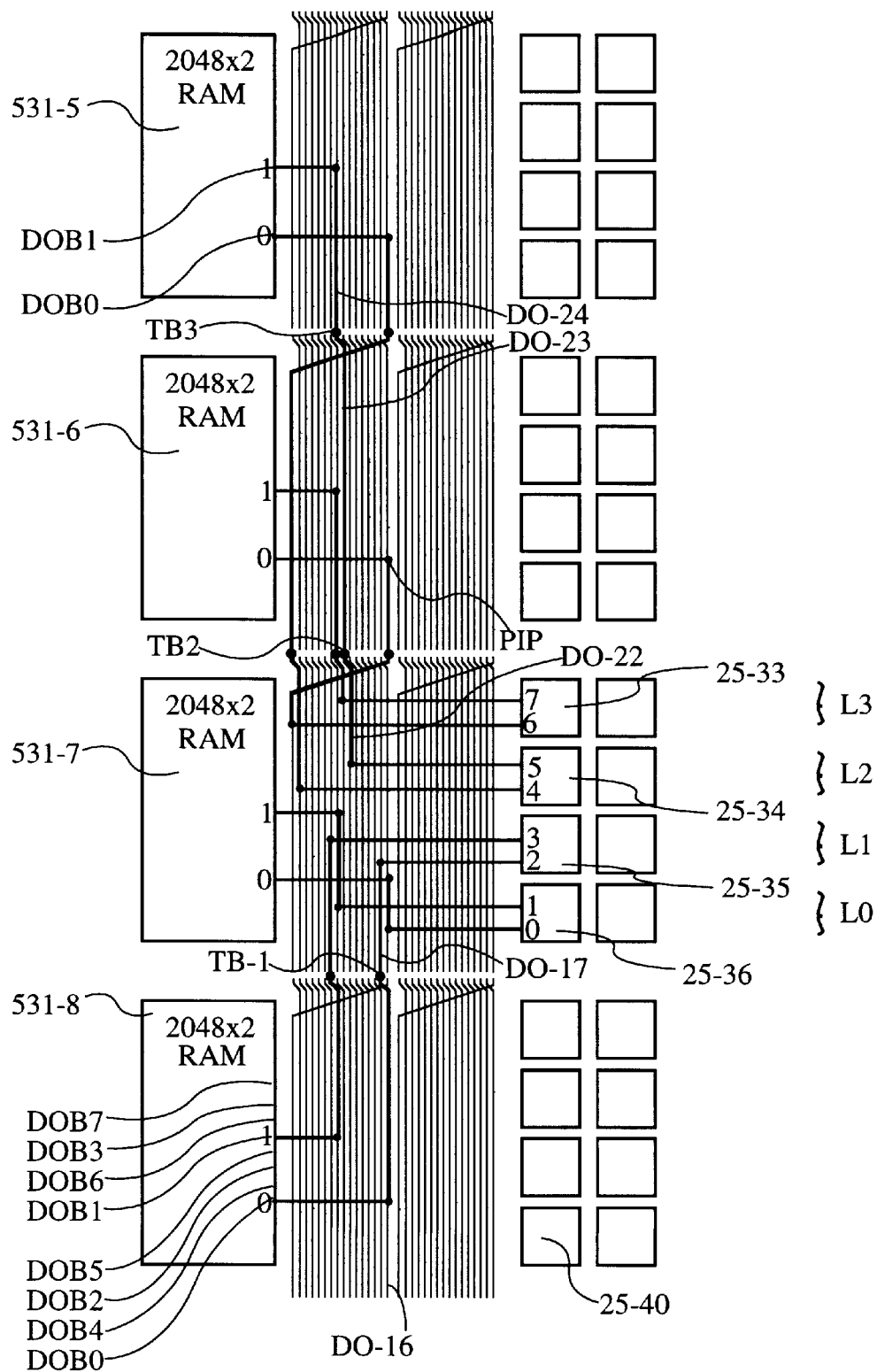

With the dedicated vertical lines and PIP pattern shown, larger RAMs are conveniently formed by connecting the vertical address, data, and control lines together. FIG. 8B illustrates use of the programmable interconnections between vertical data-out lines in adjacent RAM blocks to implement a 2048×8 RAM memory in four adjacent RAM blocks. FIG. 8B also shows how the data-out lines are connected to the logic blocks for this configuration. Logic blocks 25-33 through 25-36 receive the eight bits 0 through 7 of a data word. These four logic blocks are adjacent RAM block 531-7. But some data bits are stored in RAM blocks that are not adjacent logic blocks 25-33 through 25-36. Thus the vertical lines are used to conveniently make the transfer. For example, memory bit 2 provided to logic block 25-35 is stored in RAM block 531-8 and accessed through port DOB0. Routing is connected by turning on the PIP at the intersection of DOB0 and DO-16 adjacent RAM block 531-8, turning on the PIP at the intersection of DO-17 and L1-5 adjacent RAM block 531-7, and turning on tristate buffer TB-1, which connects vertical line DO-16 adjacent RAM block 531-8 to vertical line DO-17 adjacent RAM block 531-7. To supply bits 0 and 1 does not require that tristate buffers be used. To supply bits 2, 3, 6, and 7 requires that one tristate buffer be turned on for each bit. To supply bits 4 and 5 requires that two tristate buffers be turned on for each bit. For example, bit 5, which is supplied on output port DOBI of RAM block 531-5 is routed to its destination in logic block 25-34 by turning on tristate buffers TB2 and TB3 as well as the PIP at the intersection of DOB1 and DO-24 adjacent RAM block 531-5 and the PIP at the intersection of DO-22 and line L2-6 adjacent RAM block 531-7.

RAMs Using RAM Blocks and Logic

Additional flexibility in forming RAMs, especially large RAMs, is achieved by combining the logic and routing structures of the FPGA with the RAM blocks.

Figure 8C:
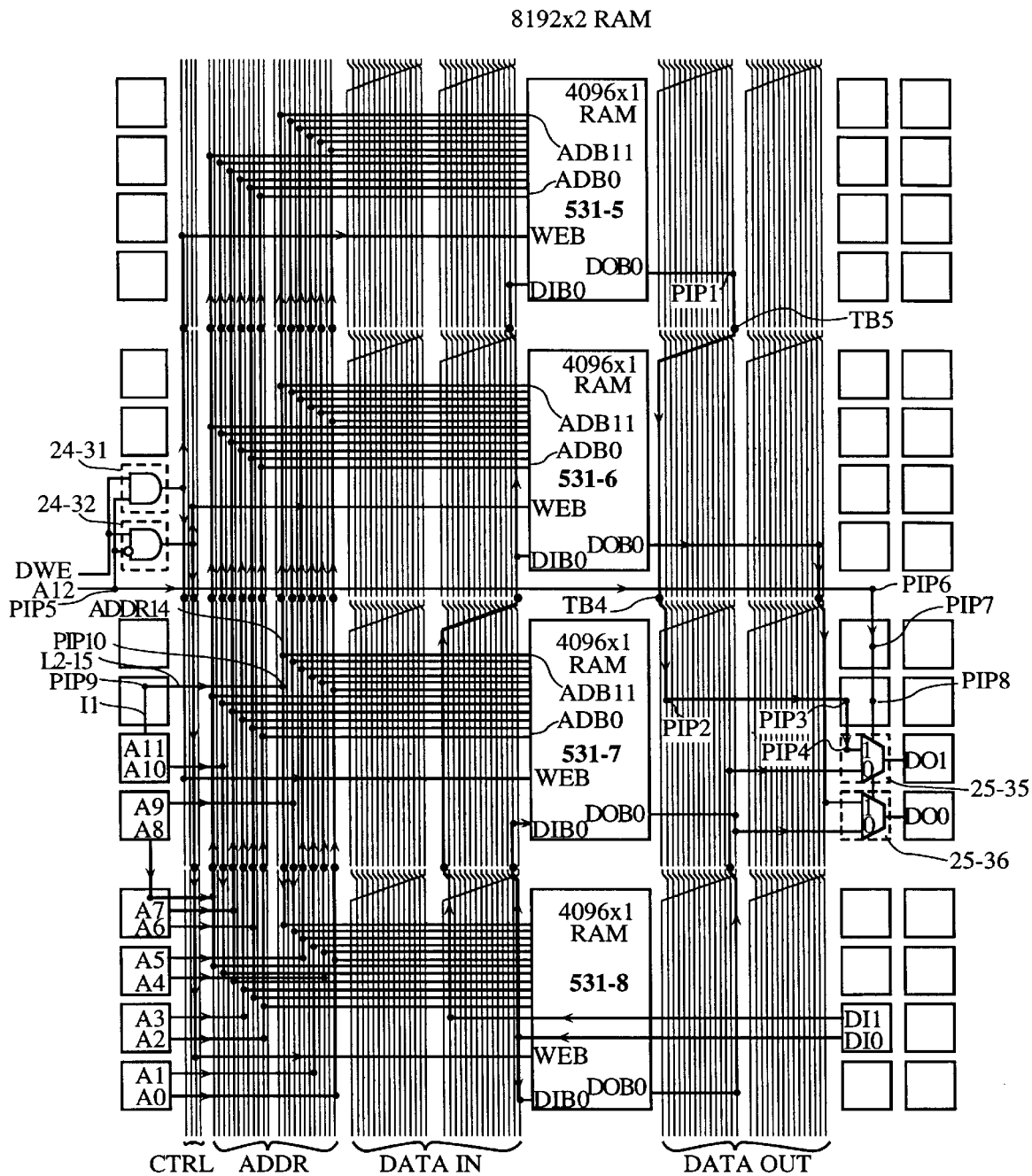

FIG. 8C shows an 8192×2 RAM formed using two logic blocks for multiplexing signals and two additional logic blocks for routing signals. FIG. 8C shows the address and data-in lines as well as the data-out lines shown in FIGS. 8A and 8B.

Since the embodiment of FIG. 7A uses 4096 memory cells in a RAM block, it takes 2 RAM blocks to store one bit of all words. In FIG. 8C, bit 0 is stored in RAM blocks 531-7 and 531-8 while bit 1 is stored in RAM blocks 531-5 and 531-6. Port B has been selected to access the memory, for both reading and writing. Writing is to port DIB0 and reading is from port DOB0. A memory 8192 cells deep requires 13 address lines. Port B has only 12 address lines. Therefore, twelve address signals A0 through A11 are applied to the 12 address ports. Ten of the 12 address signals are applied by turning on one PIP between a logic block and a vertical address line and one PIP between a vertical address line and an address port. Two of the address signals A8 and A11 are applied to corresponding address ports by routing the address signal to an adjacent logic block and from there to a vertical address line and on to an address port. For example, address signal A11 is applied to local interconnect line I1, and by turning on PIP9 to horizontal line L2-15, which is connected by turning on PIP10 to vertical interconnect line ADDR14. PIPs then connect this vertical interconnect line to address port ADB11 in each of RAM blocks 531-5 through 531-8.

The thirteenth address signal A12 is logically combined with the write enable signal DWE so that only the addressed memory cells are written. This logical combination can be done several ways. In FIG. 8C, logic blocks 24-31 and 24-32 do the logical combination of the write-enable and address signals. Logic block 24-31 generates the AND function of DWE and A12. The AND function output is applied to the write-enable ports WEB of RAM blocks 531-5 and 531-7 so that when DWE is high (data to be written) and A12 is high (the address is in the upper half of its range), a write enable signal will be applied to RAM blocks 531-5 and 531-7. Logic block 24-32 generates the AND function of DWE and the inverse of A12 so that when an address in the lower half of its range is to be written, RAM blocks 531-6 and 531-8 are enabled.

On the data-out side, logical combination with address signal A12 is performed in logic blocks 25-35 and 25-36, which are each configured as multiplexers. Data bit DO1 is generated in logic block 25-35. Logic block 25-35 receives the DOB0 output signals from RAM blocks 531-6 and 531-8. When A12 is high, the multiplexer in logic block 25-35 selects the data bit from RAM block 531-6 and when A12 is low, the multiplexer in logic block 25-35 selects the data bit from RAM block 531-8. A similar situation exists in logic block 25-36. Thus the multiplexer outputs from logic blocks 25-35 and 25-36 are the two bits DO0 and DO1 of the addressed word in the 8192-deep memory.

Note that when PIPs in the vertical lines of the RAM block were not available to connect an output signal from RAM block 531-5 to logic block 25-35, local interconnect, which is typically provided in FPGA logic blocks, carries the signal. In this example, data-out port DOB0 of RAM block 531-5 is connected to logic block 25-35 by turning on PIP1, TB5, TB4, PIP2, PIP3, and PIP4. Of these, PIP3 and PIP4 are part of the logic block local interconnect structure such as found in conventional FPGAs.

Address line A12 is routed to the multiplexer control lines of logic blocks 25-35 and 25-36 through general interconnect structure by turning on PIP5 through PIP8.

Many routing lines and interconnect structures not shown in FIG. 8C but well known in the prior art would of course be provided in a commercial embodiment of an FPGA. Since showing such structures is believed to obscure the understanding of the present invention, they have not been shown here.

Laraer RAMs

It is possible to form a 4096×16 RAM by joining together 16 RAM blocks in a vertical column before there will be any contention on the vertical address, data-in, and data-out lines. Larger memories can be formed by segmenting RAM blocks in the same vertical column, by using RAM blocks from more than one column, or by using vertical general interconnect (well known in FPGA architectures) for interconnecting or accessing portions of the RAM. As shown in FIG. 1A, an FPGA chip typically includes multiple columns of RAM blocks. Horizontal lines such as L0–L3 can be used to access more than one column of RAM blocks.

Wider RAMs are formed by connecting together more RAM blocks in a vertical column.

Other Embodiments

The embodiment of FIG. 7A shows 24 address lines, and 16 data-in and data-out lines for each port. Thus 16 vertically adjacent RAM blocks can conveniently be combined, that is, used in combination without producing contention on data-out lines or ambiguity on input lines. Other numbers of lines, other patterns of PIPs, and other sizes of RAMs can of course be used.

What is claimed is:

1. A field programmable gate array (FPGA) having a dedicated random access memory (RAM) and a RAM decoder, the RAM decoder comprising:

a logic gate for providing a decoder output signal to an enable input terminal of the dedicated RAM, wherein the dedicated RAM is enabled and disabled in response to the decoder output signal;

a plurality of multiplexers, each having an output terminal coupled to an input terminal of the logic gate, and each having a control terminal coupled to receive a corresponding enable signal; and a plurality of decoder programming lines coupled to provide input signals to the multiplexers, wherein each of the multiplexers is coupled to a corresponding set of the decoder programming lines.

2. The FPGA of claim 1, wherein one combination of the input signals provided to the multiplexers on the decoder programming lines causes all output signals from the dedicated RAM to be tri-stated.

3. The FPGA of claim 1, wherein the decoder output signal determines whether the dedicated RAM responds to any address.

4. The FPGA of claim 1, further comprising a plurality of memory cells, wherein each set of decoder programming lines is coupled to a corresponding set of memory cells, the memory cells providing the input signals.

5. The FPGA of claim 4, wherein each multiplexer is coupled to a pair of memory cells by a corresponding pair of the decoder programming lines.

6. The FPGA of claim 4, wherein one set of memory cells is programmed to store values that cause the logic gate to provide a decoder output signal that disables the dedicated RAM.

7. The FPGA of claim 4, wherein one set of memory cells is programmed to store values that cause a corresponding multiplexer to provide a signal that does not effect the decoder output signal provided by the logic gate.

8. The FPGA of claim 1, further comprising enable lines which carry the enable signals, the enable lines being part of an interconnect structure of the FPGA.

9. The FPGA of claim 4, wherein one set of memory cells is programmed to store values that cause the corresponding multiplexer to provide a signal that corresponds with the enable signal applied to the control terminal of the multiplexer.

10. A method of enabling a dedicated random access memory (RAM) on a field programmable gate array (FPGA), the method comprising the steps of:

programming a plurality of sets of memory cells, wherein each set of memory cells provides input signals to a corresponding multiplexer;

providing an enable signal to a control terminal of each multiplexer, wherein the enable signals are routed on general interconnect lines of the FPGA;

routing an input signal through each multiplexer in response to the enable signals;

providing the input signal routed through each multiplexer to an input terminal of a logic gate; and enabling and disabling the dedicated RAM in response to an output signal provided by the logic gate.

11. The method of claim 10, further comprising the step of tri-stating all output signals from the dedicated RAM in response to one combination of input signals provided to the multiplexers by the memory cells.

12. The method of claim 10, further comprising the step of programming a set of memory cells to store values that cause the logic gate to provide an output signal that disables the dedicated RAM.

13. The method of claim 10, further comprising the step of programming a set of memory cells to store values that cause a corresponding multiplexer to provide a signal that does not effect the output signal provided by the logic gate.

14. The method of claim 10, further comprising the step of programming a set of memory cells to store values that cause a multiplexer to route a signal that corresponds with the enable signal applied to the control terminal of the multiplexer.

* * * * *